United States Patent [19]

Petty

[11] Patent Number: 4,906,867
[45] Date of Patent: Mar. 6, 1990

[54] BUFFER CIRCUIT WITH LOAD SENSITIVE TRANSITION CONTROL

[75] Inventor: William K. Petty, Colorado Springs, Colo.

[73] Assignee: NCR Corporation, Dayton, Ohio

[21] Appl. No.: 269,022

[22] Filed: Nov. 9, 1988

[51] Int. Cl.$^4$ .................. H03K 17/16; H03K 19/094; H03K 17/56

[52] U.S. Cl. ................................... 307/443; 307/451; 307/473; 307/246; 307/263

[58] Field of Search .............. 307/443, 445, 451, 473, 307/246, 263, 571

[56] References Cited

U.S. PATENT DOCUMENTS

| | | | |
|---|---|---|---|
| 4,622,482 | 11/1986 | Ganger | 307/263 |
| 4,779,013 | 10/1988 | Tanaka | 307/443 |
| 4,783,601 | 11/1988 | Hartgring et al. | 307/246 |
| 4,785,201 | 11/1988 | Martinez | 307/443 |
| 4,800,298 | 1/1989 | Yu et al. | 307/443 |

OTHER PUBLICATIONS

Kam Leung, "Controlled Slew Rate Output Buffer", IEEE 1988 Custom Integrated Circuits Conference, pp. 5.5.1–4.

Primary Examiner—Stanley D. Miller
Assistant Examiner—Margaret Wambach
Attorney, Agent, or Firm—Wilbert Hawk, Jr.; Douglas S. Foote; Casimer K. Salys

[57] ABSTRACT

A buffer circuit particularly suited for driving the output pad of an integrated circuit, characterized in its provision of features which limit the rate of change of current flow in the power supply and ground lines to reduce noise. The circuit features feedback responsive compensation for variations in the capacitive load on the pad. In one form, the circuit includes a feedback capacitor between the pad and the control gate of the output transistor pulling the pad. The control gate of such pulling output driver transistor is, under one operational condition, provided with a voltage which increases at a limited rate during current enablement. The steady-state enablement of the output driver transistor is established later by a circuit logically responsive to the voltage on the output pad. The output driver transistor is subject to rapid disablement in response to a pulling of the control gate by a high speed and drive capacity transistor. In a preferred arrangement the circuit includes tri-state operation capability.

15 Claims, 4 Drawing Sheets

BUFFER CIRCUIT WITH LOAD SENSITIVE TRANSITION CONTROL

CROSS-REFERENCE TO RELATED APPLICATIONS

The present invention relates to the inventions as set forth in the U.S. patent applications having Ser. Nos. 07/072,831 and 07/233,506, to the extent that this invention pursues the elimination of a similar problem.

BACKGROUND OF THE INVENTION

The voltage spikes which appear as noise on the ground lines and power supply lines of integrated circuit devices have increased both in prevalence and relative magnitude with the evolution toward smaller integrated circuit dimensions. Investigations have established that the resistance and inductance of the interconnect lines within the integrated circuit chip have become major sources of transient noise voltages. Rapid changes of current to and from the power supply and ground pads contribute significantly to the levels of noise on such corresponding lines throughout the chip. Concurrently, decreases in integrated circuit dimensions constrain designers from materially reducing the power supply and ground line impedance levels by expanding line widths. Attempts to eliminate or suppress noise sources are further complicated by the increases in the integrated circuit device switching speeds and their associated di/dt effects.

Integrated circuit power supply and ground line noise signals attributable to resistance and di/dt effects appear most often when input/output (I/O) buffers are used to switch capacitive loads. The significance of this noise source is expected to increase with the use of more CMOS type integrated circuits, in that CMOS integrated circuit loads are predominantly capacitive.

The above-identified copending applications relate to inventions which suppress switching noise. U.S. Patent application Ser. No. 07/072,831 utilizes parallel configured sets of inverter transistors which are enabled in timed succession to increase with time the effective current passed to the pad. The other referenced copending patent application, identified as Ser. No. 07/233,506, involves a pad driver circuit which incrementally increases the signal used to drive the output pad voltage. The objectives of the two referenced applications are in distinct contrast to the present invention, particularly to the extent that the present invention is responsive in a feedback sense to the capacitive magnitude of the load.

A number of circuits and techniques to eliminate or suppress power supply and ground line noise have been proposed in prior references. For example, U.S. Pat. No. 4,129,792 defines a circuit in which the output drive current is contributed by two or more switching devices enabled in timed succession depending on the switching speed of cascaded transistor stages. U.S. Pat. No. 4,638,187 teaches another arrangement of parallel connected transistor stages, successively enabled in time to minimize current spike effects. A further arrangement is taught in U.S. Pat. No. 4,727,266, wherein the output current is limited merely by undersizing the dimensions of the transistors furnishing current to the control electrode of the output inverter stage. And lastly, application of a concept similar to one set forth in U.S. Pat. application Ser. No. 07/072,831 appears in the article authored by Leung, entitled "Controlled Slew Rate Output Buffer", and which was published in the proceedings of the IEEE 1988 Custom Integrated Circuit Conference on pages 5.5.1–5.5.4.

Although the techniques disclosed in the various references eliminate some power supply line and ground line switching noise problems typical of advanced integrated circuit products, there remains a need for a circuit which adjusts the rate of change of the output buffer current in relation to the magnitude of the capacitive load on the output pad. Preferably, such rate of change compensation would, in response to feedback signals, limit rapid current changes and thereby constrain associated power supply and ground line di/dt noise levels.

SUMMARY OF THE INVENTION

The present invention relates to a composite buffer and output driver circuit which controls the output signal di/dt through feedback means, ensures full pull-up of the output stage following transition, and controls the turn-on rate of the output transistor to limit the instantaneous current furnished to large capacitive loads. The combination of these features in a buffer circuit provides load responsive feedback sensitivity, reduces current surge noise, and ensures concluding DC voltage levels of appropriate magnitudes.

The invention as preferably embodied incorporates capacitive feedback between the output node and the control electrode of the output transistor to adjust the switching rate of the output transistor in relation to the capacitive load. The turn-on current spike in the output transistor is further controlled by a resistive element interposed between the output transistor control gate and the switched source of the control signal.

The steady-state voltage on the output node is established using a pull-up transistor driven by a logic gate output signal. The output state of such logic gate is based upon the combination of the input command signal and the level of the output node voltage in its progression toward the final steady-state level.

For the preferred tri-state configuration using push-pull output transistors, the invention also includes a pull-down transistor acting upon the control gate of the previously noted output transistor. The pull-down transistor is designed to switch the control gate of the output transistor significantly faster than the control gate is switched during turn-on. This avoids a switching overlap type of short circuit condition when complementary pairs of transistors are used to drive the output. Tri-state operation is enabled through multiple logic gates, which selectively interact with the turn-on and steady-state control signals.

These and other features of the invention will be more fully understood and appreciated upon considering the detailed description which follows.

DESCRIPTION OF THE PREFERRED EMBODIMENT

Figure 1:
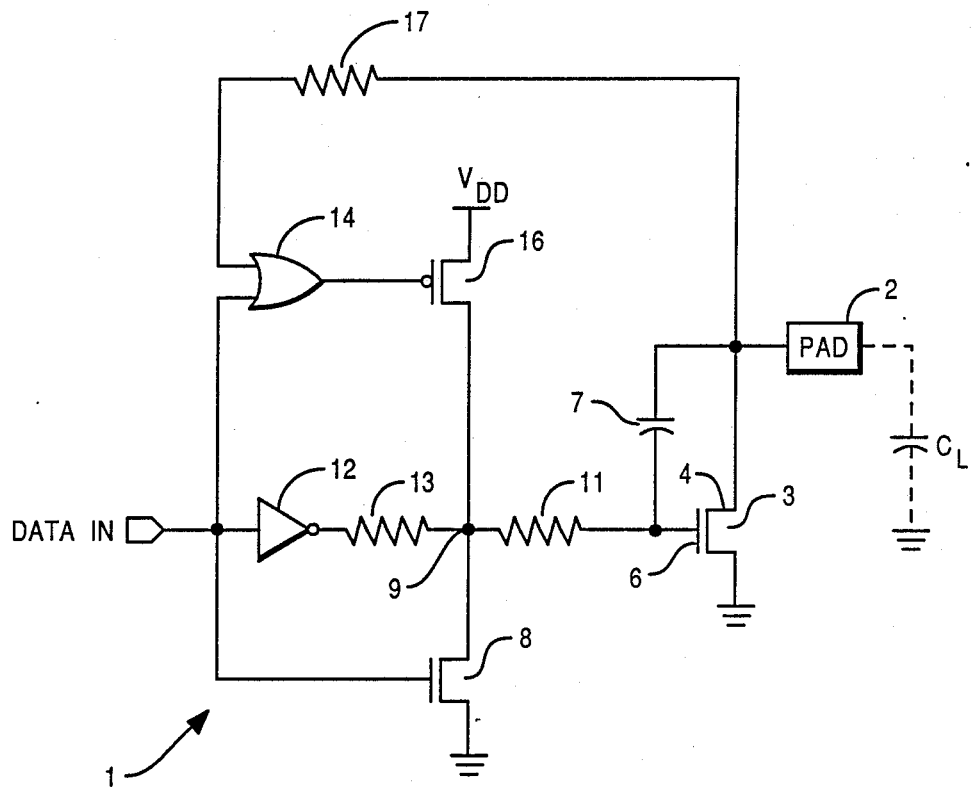
FIG. 1 is a circuit schematically illustrating the basic features of the invention.

Buffer circuit 1 in FIG. 1 illustrates in a fundamental form the elements which contribute to the present invention. The circuit is particularly suited to drive an output pad of an integrated circuit in response to signals generated within the integrated circuit. The schematic in FIG. 1 also includes the output pad 2 and a representative capacitive pad load $C_L$. In the context of the schematic in FIG. 1, the objective is to accept high switching rate DATA IN signals and have field effect transistor 3 drive the output pad 2 accordingly while minimizing the di/dt effects on the ground line.

The objectives are satisfied through the contribution of three circuit structure arrangements. First, n-channel output driver field effect transistor 3 has a slew rate limiting feedback capacitor 7 connected between its source electrode 4 and its control gate electrode 6. Second, pull-up action on node 9 and its progressive effect on control electrode 6 to enable driver transistor 3 is constrained by the limited output capacity of inverter 12. Consequently, the slew rate of rising voltage on the gate electrode 6 which enables transistor 3 is reduced through the combined effects of limited drive inverter 12, resistor 11, resistor 13 and capacitor 7. Positive transitioning DATA IN signals are used to directly enable relatively large and fast transistor 8. Transistor 8 pulls node 9 and gate electrode 6 of transistor 3 toward ground significantly faster than the rate at which node 9 is able to transition in the positive direction. The third aspect of the invention arises from the logical combination of signals entering OR gate 14. OR gate 14 combines the DATA IN signal and a feedback signal from pad 2, defining therefrom an output signal to drive p-channel transistor 16. Preferably, OR gate 14 enables transistor 16, to pull node 9 to the supply voltage $V_{DD}$, after the DATA IN signal is low and the voltage on pad 2 has decreased to approximately half the supply voltage. This third aspect of the invention ensures that the concluding or steady state drive to transistor 3 from node 9 is based upon the full voltage of the power supply $V_{DD}$.

A nominal value for feedback capacitor 7 is in the range of 2 picofarads for an output transistor 3 which is designed to drive a nominal capacitive load $C_L$ of 50 picofarads and to exhibit a nominal DC current conduction capability of 24 milliamps. For these capacities, resistors 11 and 13 nominally range from 300 to 400 ohms, while feedback resistor 17 is nominally 250 ohms in value. The physical dimensions and electrical characteristics of pull-down transistor 8 should be selected to ensure that the pull-down rate of gate electrode 6 is approximately four times the pull-up rate produced by inverter 12.

Figure 2:
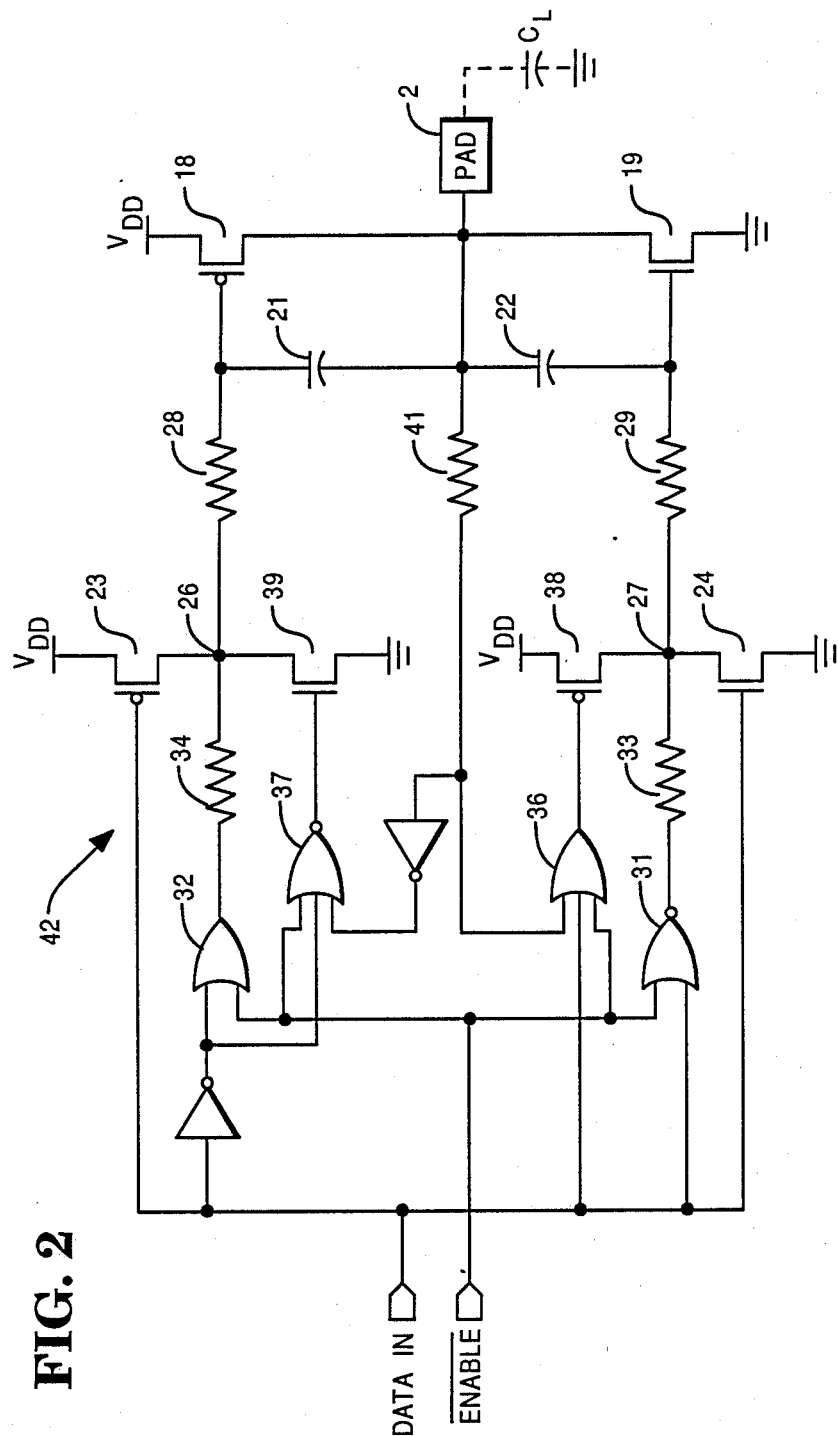
FIG. 2 is a schematic showing a preferred arrangement of the invention with CMOS field effect transistors and tri-state control.

A preferred and fully implemented arrangement of the invention, as first rudimentally depicted in FIG. 1, appears in FIG. 2. The circuit now incorporates a tri-state capability with a selectively operable enable mode responsive to an ENABLE signal. To implement the tri-state capability required of the circuit, output pad 2 is driven by a complementary pair of field effect transistors, with p-channel transistor 18 pulling pad 2 to the power supply node $V_{DD}$ and n-channel transistor 19 pulling pad 2 to ground potential. The control or gate electrodes of each of the output pad driver transistors 18 and 19 are coupled through respective feedback capacitors 21 and 22 to the node represented by pad 2.

The gate electrodes of transistors 18 and 19 are themselves individually driven by electrically complementary pulling transistors 23 and 24, which pulling transistors act upon intermediate nodes 26 and 27 in direct response to the DATA IN signal level. Again, intermediate nodes 26 and 27 are separated from the control gate electrodes of driver transistors 18 and 19 by respective resistors 28 and 29.

The limited current drive capacity of NOR gate 31, as further constrained by resistors 29 and 33, and feedback capacitor 22, together establish the initial slope of the pad-to-ground current conducted by pull-down driver transistor 19. The current capacity of OR gate 32, interacting with capacitor 21 through resistors 28 and 34, provides a corresponding effect on the pull-up driver transistor 18.

In keeping with the concepts introduced with reference to the structure in FIG. 1, resistors 33 and 34 separate respective logic gates 31 and 32 from intermediate nodes 27 and 26 to establish a relative difference in the rate of change of the control gate voltages on the driver transistors 18 and 19 depending on whether the input signal transition is high-to-low or low-to-high. Larger, faster and more directly connected transistors 23 and 24 disable their respective output driver transistors 18 and 19 approximately four times faster than the enablement effectuated by respective gates 37 and 36 to eliminate inadvertent and undesirable simultaneous enablements of both transistors 18 and 19. This factor of four is believed to provide a sufficient margin, between the disablement of one output driver transistor and the enablement of its complement transistor, to offset performance differences attributable to normal fabrication process variations.

The steady-state signals on output pad 2 are again guaranteed appropriate by logic gates sensing the state of the output pad voltage. In this embodiment, OR gate 36 and NOR gate 37 acting respectively on p-channel transistor 38 and n-channel transistor 39 to fully pull the respective intermediate nodes 27 and 26 to the appropriate power supply and ground potential levels for complete enablement of the output driver transistors 19 and 18. Again, it is preferred that logic gates 36 and 37 respond to the feedback signal conveyed through resistor 41 from pad 2 when the pad voltage reaches approximately half the power supply voltage.

A high level signal on the ENABLE/ line places buffer circuit 42 in FIG. 2 into a tri-state mode of operation, whereupon pad 2 is to be simultaneously disconnected from both the power supply and ground lines. This is accomplished by concurrently disabling both the output driver transistors 18 and 19. The ENABLE/ state is conveyed to the gates which define the initial rate of rise of current, namely, gates 31 and 32, as well as the gates which establish the steady-state voltages on nodes 27 and 26, namely, gates 36 and 37.

The ability of the circuit in FIG. 2 to materially reduce ground and power supply line noise spikes attributable to high rates of change of current, di/dt, is evidenced in the succession of performance plots depicted in FIGS. 3–10. Each of the figures shows a pad output voltage transition of approximately 5 volts and the noise voltage level on the related supply voltage or ground line. FIGS. 3–6 are waveforms for pads loaded at a nominal level of 20 picofarads, while FIGS. 7–10 relate to pads having nominal 120 picofarad loads.

Figure 3:
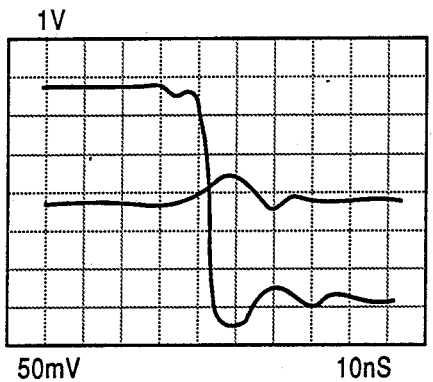
FIGS. 3–10 are plots illustrating the relative performance levels of the preferred embodiment and representative prior art.
Figure 4:
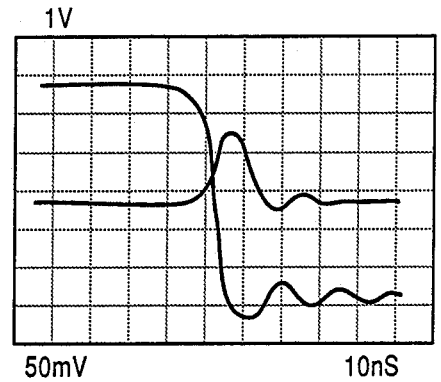
Figure 5:
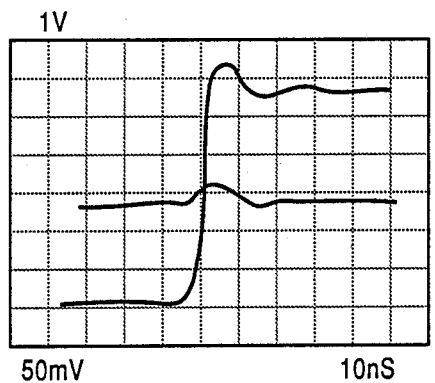
Figure 6:
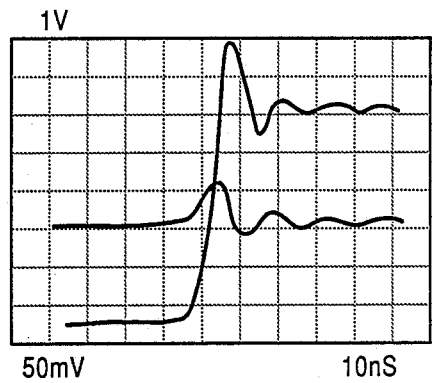
Figure 7:
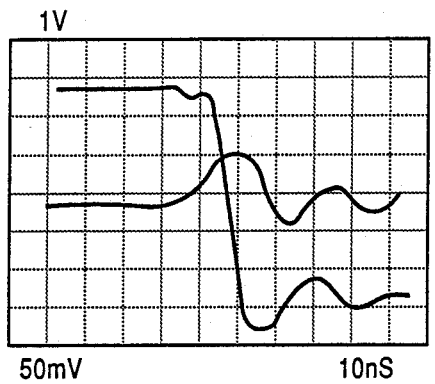
Figure 8:
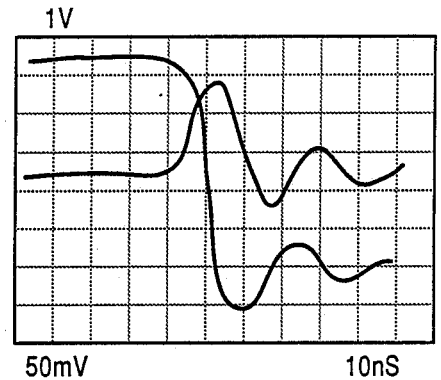
Figure 9:
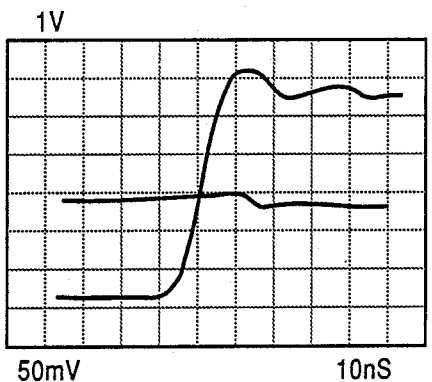
Figure 10:
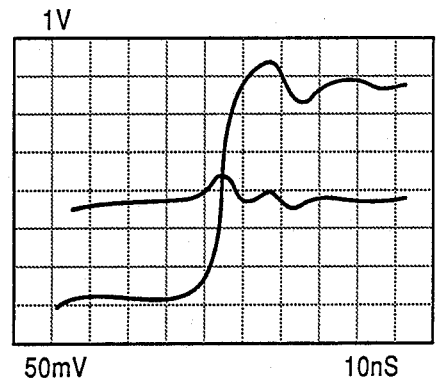

The waveforms in FIG. 3 are attributable to a high-to-low voltage transition of the pad voltage for the circuit in FIG. 2, while FIG. 4 is the corresponding transition performance of a relatively comparable prior art output pad driver circuit. Similarly, FIG. 5 illustrates the positive going transition and associated noise for the circuit of the present invention, while FIG. 6 illustrate the corresponding performance of the prior art. The effects of a larger capacitive load on the circuit of the present invention under the high-to-low transition condition are illustrated in FIG. 7, while the effects of the corresponding conditions on the prior art circuit are shown in FIG. 8. FIG. 9 illustrates the low-to-high transition for the present invention circuit under heavy capacitive load, while FIG. 10 is representative of the prior art performance. A comparison of the noise levels clearly establishes the improved performance exhibited by the present circuit. For instance, a relative 50 millivolts peak-to-peak of noise is exhibited by the present invention in FIG. 3 compared to more than twice that amount for the prior art in FIG. 4.

The 20 picofarad load used for the plots in FIGS. 3-6 is attributable to the test oscilloscope, the pad being otherwise unloaded. The 120 picofarad loads used for the test results shown in by FIGS. 7-10 involved the addition of 100 picofarad passive loads to pad 2.

The importance of the feedback capacitors 21 and 22 within the circuit of FIG. 2 should not be underestimated. Not only do the capacitors contribute to the shaping of the waveforms during the three increments of operation described in detail hereinbefore, but they provide negative feedback suitable to constrain the switching rates for low levels of capacitive load on the output pad 2. Whereas most prior art developments focus solely on limiting the current flow through the driver transistors for heavy capacitive load conditions, the present circuit extends the range of the control into low capacitive loading ranges with high di/dt effects. All high rates of change of voltage on the pad are fed back through the capacitors 21 or 22 to the gate electrodes of the driver transistors. Consequently, the present circuit provides both open loop and closed loop compensation for variations of capacitive load on the pad, a class of load typical for contemporary and advanced CMOS class integrated circuit devices.

It will be understood by those skilled in the art that the embodiments set forth hereinbefore are merely exemplary of the numerous arrangements by which the invention may be practiced, and as such may be replaced by equivalent without departing from the invention which will now be defined by appended claims.

I claim:

1. A buffer circuit with load sensitive transition control, comprising:
   an output node, driven by a first transistor connected to a first side of a power supply;
   capacitive feedback means connected between the output node and a control electrode of the first transistor;
   a second transistor connected between the control electrode of the first transistor and the first side of the power supply to rapidly pull the control electrode of the first transistor to the potential of said first side of the power supply responsive to a DATA IN signal first state; and
   a switch means connected between a second side of the power supply and the control electrode of the first transistor to slowly pull the control electrode of the first transistor toward the second side of the power supply responsive to a DATA IN signal second state.

2. The apparatus recited in claim 1, further including:
   a logic means responsive to the combination of a voltage level from the output node and the DATA IN signal second state for further pulling the control electrode of the first transistor to the potential of said second side of the power supply.

3. The apparatus recited in claim 1, wherein the second transistor connected to rapidly pull the control electrode is connected to the control electrode of the first transistor through a resistor.

4. The apparatus recited in claim 3, wherein the switch means connected to slowly pull the control electrode is a relatively low current driver operable to pull the control electrode at approximately one fourth the pull rate of the second transistor.

5. The apparatus recited in claim 4, wherein the switch means includes a transistor which is connected to the second side of the power supply and through resistive means to the control node of the first transistor.

6. The apparatus recited in claim 5, wherein the output node is a pad of an integrated circuit and the transistors are field effect devices.

7. The apparatus recited in claim 2, wherein the second transistor connected to rapidly pull the control electrode is connected to the control electrode of the first transistor through a resistor.

8. The apparatus recited in claim 7, wherein the switch means connected to slowly pull the control electrode is a relatively low current driver operable to pull the control electrode at approximately one fourth the pull rate of the second transistor.

9. The apparatus recited in claim 8, wherein the switch means includes a transistor which is connected to the second side of the power supply and through resistive means to the control node of the first transistor.

10. The apparatus recited in claim 9, wherein the output node is a pad of an integrated circuit and the transistors are field effect devices.

11. The apparatus recited in claim 10, wherein the logic means is an OR gate which pulls to the potential of said second side of the power supply.

12. The apparatus recited in claim 11, wherein the OR gate is responsive to an output mode voltage level of nominally half the power supply voltage.

13. The apparatus recited in claim 1, including a complement circuit thereof, sharing a common output node and a common set of DATA IN signals.

14. The apparatus recited in claim 12, further including means for selectively disabling the first transistor.

15. The apparatus recited in claim 14, wherein the means for selectively disabling concurrently disables the second transistor and the switch means.

* * * * *